(12) United States Patent
Stickel

(10) Patent No.: US 10,497,403 B2
(45) Date of Patent: *Dec. 3, 2019

(54) POWER DELIVERY CIRCUITRY

(71) Applicant: Micron Technology, Inc., Boise, ID (US)

(72) Inventor: Shaun Alan Stickel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/411,899

(22) Filed: May 14, 2019

(65) Prior Publication Data

US 2019/0267048 A1 Aug. 29, 2019

Related U.S. Application Data

(63) Continuation of application No. 15/900,553, filed on Feb. 20, 2018, now Pat. No. 10,304,499, which is a continuation of application No. 15/665,062, filed on Jul. 31, 2017, now Pat. No. 9,922,683, which is a continuation of application No. 15/169,075, filed on May 31, 2016, now Pat. No. 9,747,957.

(51) Int. Cl.
*G11C 5/14* (2006.01)
*G11C 7/24* (2006.01)
*G11C 14/00* (2006.01)
*G11C 16/30* (2006.01)

(52) U.S. Cl.
CPC .............. *G11C 5/141* (2013.01); *G11C 5/143* (2013.01); *G11C 7/24* (2013.01); *G11C 14/00* (2013.01); *G11C 16/30* (2013.01)

(58) Field of Classification Search
CPC ........... G11C 5/141; G11C 5/143; G11C 7/24; G11C 14/00; G11C 16/30
See application file for complete search history.

(56) References Cited

U.S. PATENT DOCUMENTS

| | | | |
|---|---|---|---|
| 5,982,146 A | 11/1999 | Nguyen | |
| 7,778,101 B2 | 8/2010 | Chen | |
| 8,023,355 B2 | 9/2011 | Murakami et al. | |
| 8,031,551 B2 * | 10/2011 | Wilson | G11C 5/141 365/185.21 |
| 9,042,197 B2 * | 5/2015 | Allison | G11C 5/005 365/228 |
| 9,207,739 B2 | 12/2015 | Richards et al. | |
| 9,747,957 B1 * | 8/2017 | Stickel | G11C 5/141 |
| 9,922,683 B2 * | 3/2018 | Stickel | G11C 5/141 |
| 10,304,499 B2 * | 5/2019 | Stickel | G11C 5/141 |
| 2010/0241890 A1 | 9/2010 | Goodart et al. | |
| 2012/0023339 A1 | 1/2012 | Chueh et al. | |
| 2014/0129759 A1 | 5/2014 | Sauber et al. | |
| 2016/0077560 A1 | 3/2016 | Stickel et al. | |
| 2016/0225459 A1 | 8/2016 | Boysan et al. | |

* cited by examiner

*Primary Examiner* — Pho M Luu
(74) *Attorney, Agent, or Firm* — Fletcher Yoder, P.C.

(57) ABSTRACT

A memory device may include a memory system and an energy storage device. Additionally, the energy storage device may supply a first power to the memory system when a second power from a power supply is eliminated or insufficient.

20 Claims, 3 Drawing Sheets

POWER DELIVERY CIRCUITRY

CROSS-REFERENCE TO RELATED APPLICATION

This application is a Continuation of U.S. patent application Ser. No. 15/900,553 filed on Feb. 20, 2018, now U.S. Pat. No. 10,304,499 issued on May 28, 2019, which is a Continuation of U.S. patent application Ser. No. 15/665,062 filed on Jul. 31, 2017, now U.S. Pat. No. 9,922,683 issued on Mar. 20, 2018, which is a continuation of and claims priority to U.S. patent application Ser. No. 15/169,075 filed on May 31, 2016, now U.S. Pat. No. 9,747,957 issued on Aug. 29, 2017, all of which are herein incorporated by reference.

BACKGROUND

1. Field of the Invention

Embodiments of the present invention relate generally to the field of memory devices and other systems and more particularly, to systems and methods of providing power for memory devices and other systems.

2. Description of the Related Art

Computer systems and other electrical systems generally include one or more memory devices. Memory devices generally include circuits (e.g., integrated circuits, semiconductor circuits, etc.) configured to store data. For example, the memory devices may include volatile and/or non-volatile memory. Examples of types of volatile memory, which require power to retain stored information, include random-access memory (RAM), dynamic random access memory (DRAM), synchronous dynamic random access memory (SDRAM), among others. Non-volatile memory does not require power to retain stored information and can include read only memory (ROM), flash memory (e.g., NAND flash memory and NOR flash memory), phase change random access memory (PCRAM), resistive random access memory (RRAM), magnetic random access memory (MRAM), and so forth.

Solid state drives (SSDs) may be formed with various types of memory devices (e.g., solid state memory devices). Unlike hard disk drives (HDDs), solid state drives do not include moving parts, and therefore may not be susceptible to vibration, shock, magnetic fields, etc., and may have reduced access times and latency. A solid state drive may be formed from volatile memory devices and/or non-volatile memory devices. For example, a solid state drive may be a NAND flash memory device that does not include an internal battery. In certain configurations, the solid state drive may be connected to an external power supply. Unfortunately, power requirements (e.g., temporary power requirements) of the solid state drive may exceed the power supplying capacity of the external power supply. As a result, solid state drives may experience an increase in latency (i.e., response time) during periods when power demand of the solid state drive exceeds the power supplying capacity of the external power supply. Further, temporary power outages of the external power supply may result in a loss of data waiting to be stored in the memory, or an interruption in reading data from the memory.

Moreover, when a solid state drive includes an internal power storage device, such as a high voltage backup capacitor, the design may be cost prohibitive for many applications of the solid state drive. For example, the high voltage backup capacitor may include a dedicated charging circuit and a dedicated discharging circuit. The additional circuitry may increase costs associated with providing backup or supplemental power to the solid state drive, and the additional circuitry may also populate valuable space on a printed circuit board of the solid state drive.

DETAILED DESCRIPTION OF SPECIFIC EMBODIMENTS

Embodiments of the present disclosure are directed to a system including a memory device having power delivery circuitry that delivers power to the system when a power source (e.g., an external power source) becomes unavailable. For example, the memory device may include an onboard energy storage component that stores available input power (i.e., energy) of the external power source in the energy storage component when the external power source provides power to the memory device. In other words, when the external power supply operates under normal conditions, the onboard energy storage component of the memory device may draw and store power from the external power supply.

Thereafter, when the external power supply is removed from the system, energy stored in the onboard energy storage component may be released and used by the memory device. In this manner, the memory device may continue operating for a period of time after removal of the external power supply. Further, when the memory device demands an amount of power in excess of the power limit of the external power supply, additional energy stored in the onboard energy storage component may be released and used by the memory device. In this manner, the memory device may utilize more power than the external power supply is capable of providing without overloading the external power supply. As discussed in detail below, then energy storage component and the power delivery circuitry may enable improved performance of the memory device. For example, the energy storage component and the power delivery circuitry may enable a reduction in latency (i.e., response time) of the memory device. In certain embodiments, the power delivery circuitry may also be utilized as a power backup system. While the present embodiments describe the power delivery circuitry in the context of a memory device, it should be noted that the power delivery circuitry described below may also be used with other systems that draw power from a power supply. For example, the disclosed power delivery circuitry may be used with a video card, a personal computer motherboard, a cellular phone, or other system.

Figure 1:
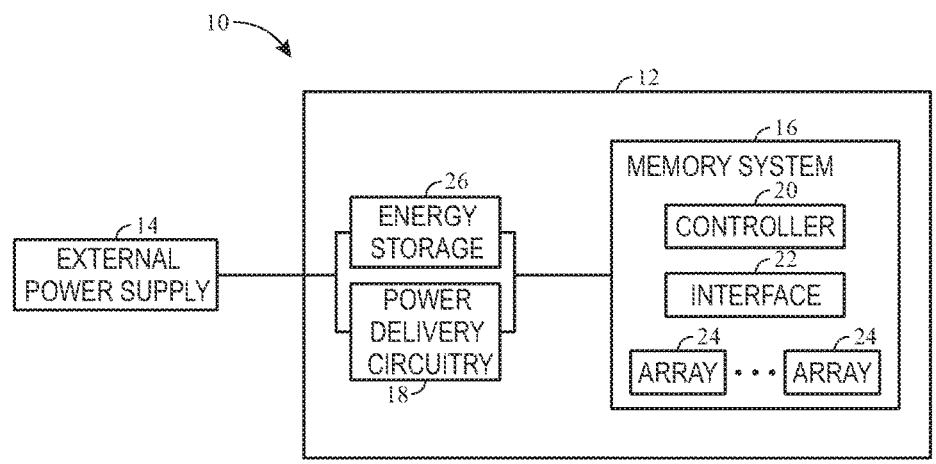
FIG. 1 is a block diagram of a system having an external power supply and memory device with power delivery circuitry, in accordance with an embodiment.

Referring now to the drawings, FIG. 1 is a block diagram that depicts a system 10 including a memory device 12 powered by an external power supply 14. The system 10 may be any of a variety of systems, such as those used in a personal computer, pager, cellular phone, personal organizer, control circuit, laptop computer, digital camera, digital media player, etc. The memory device 12 may be any of a variety of memory devices configured to store data, such as a solid state drive. As will be appreciated, the external power supply 14 provides power to the memory device 12 to enable operation of the memory device 12.

In the illustrated embodiment, the memory device 12 (e.g., solid state drive) includes a memory system 16 and power delivery circuitry 18. The power delivery circuitry 18 will be described in further detail below. As shown, the memory system 16 includes a controller 20, an interface 22, and memory arrays 24 (e.g., solid state memory arrays). The controller 20 communicates with the memory arrays 24 to read, write, and/or erase data on the memory arrays 24. Additionally, the controller 20 may communicate with another system or device coupled to the memory device 12 or the system 10. For example, the controller 20 may communicate with another system or device through the interface 22. As such, the interface 22 may be configured to transmit data, power, input/output signals, or other types of signals. In certain embodiments, the interface 22 may be an integrated drive electronics (IDE) interface, an advanced technology attachment (ADA) interface, a serial advanced technology attachment (SATA) interface, a parallel advanced technology attachment (PATA) interface, or other type of interface.

As mentioned above, the memory device 12 includes power delivery circuitry 18. The power delivery circuitry 18 is configured to deliver power from the external power supply 14 to the memory system 16 of the memory device 12. Additionally, in certain embodiments, an energy storage device 26 may store energy supplied by the external power supply 14, and the stored energy may be released and delivered to the power delivery circuitry 18 when the external power supply 14 is removed from the memory device 12 and/or a power demand of the memory system 16 exceeds the power supplying limits of the external power supply 14. For example, the energy storage device 26 may be a battery, a capacitor, a super-capacitor, or other type of energy storage. In the manner described below, the energy storage device 26 may draw and store available input energy from the external power supply 14 when the memory device 12 is not using all of the available power supplied by the external power supply 14 or when the memory system 16 is idle. Thereafter, during events when the memory system 16 demands a level of power in excess of the power supply limit of the external power supply 14, or when the external power supply 14 is removed from the memory device 12, the energy stored within the energy storage device 26 may be released and delivered, along with or as a backup to the power from the external power supply 14, to the memory system 16 by the power delivery circuitry 18.

For example, in one embodiment, the external power supply 14 may be capable of supplying 200 mW of power to the memory device 12. However, the memory system 16 (e.g., solid state drive) of the memory device 12 may have idle periods or other operational periods when the memory system 16 does not use 200 mW. Instead, the memory system 16 may operate using less than 200 mW (e.g., 150 mW, 100 mW, or less power). During such idle or operational periods, the power delivery circuitry 18 may supply the less than 200 mW of power demanded by the memory system 16, and the energy storage device 26 may use additional power from the external power supply 14 to store energy resulting from the additional power provided to the energy storage device 26. If the memory system 16 later demands a power supply in excess of 200 mW (e.g., in excess of the power supply limit of the external power supply 14), the power delivery circuitry 18 may deliver the 200 mW supplied by the external power supply 14 along with additional power from the energy storage device 26 to meet the demand of the memory system 16. For example, if the memory system 16 demands 225 mW during a peak workload of the memory system 16, the power delivery circuitry 18 may simultaneously deliver 200 mW supplied by the external power supply 14 and 25 mW supplied by the energy storage device 26 to the memory system 16. As a result, performance of the memory system 16 may be improved. More specifically, the memory system 16 may not throttle performance back to operate within the power supply limit of the external power supply 14. Instead, the memory system 16 may perform a data transaction at a faster rate, and latency of the memory system 16 may be reduced. Additionally, as discussed in greater detail below, the energy storage device 26 may also provide backup power to the power delivery circuitry 18 when the external power supply 14 is removed from the memory device 12.

Figure 2:
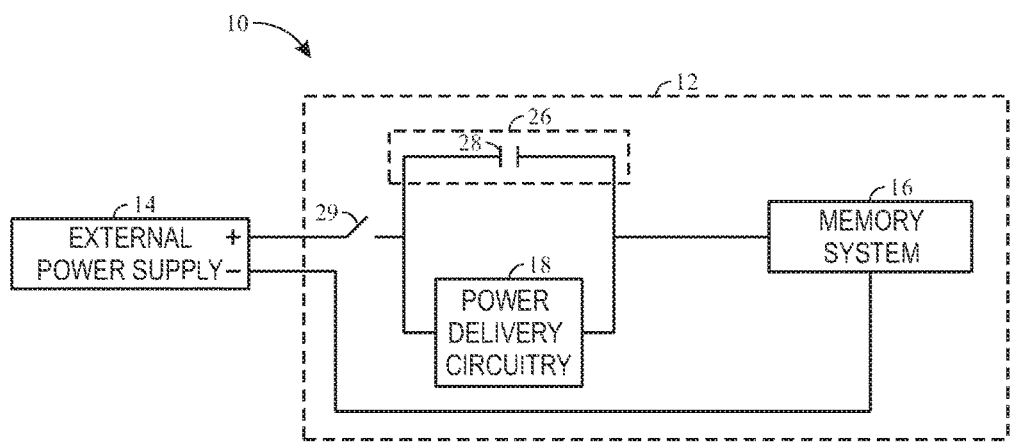
FIG. 2 is a block diagram of a system having an external power supply and memory device with power delivery circuitry, illustrating an embodiment of the power delivery circuitry.
Figure 3:
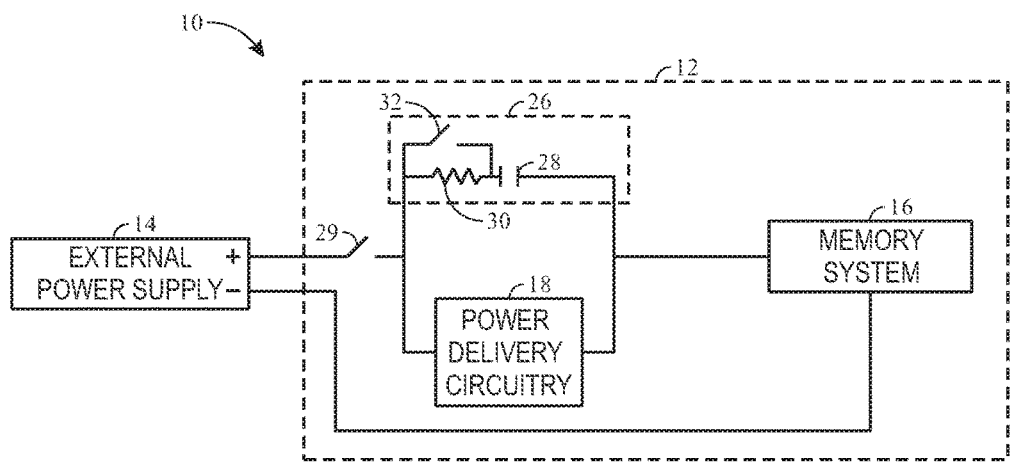
FIG. 3 is a block diagram of a system having an external power supply and memory device with power delivery circuitry, illustrating another embodiment of the power delivery circuitry.
Figure 4:
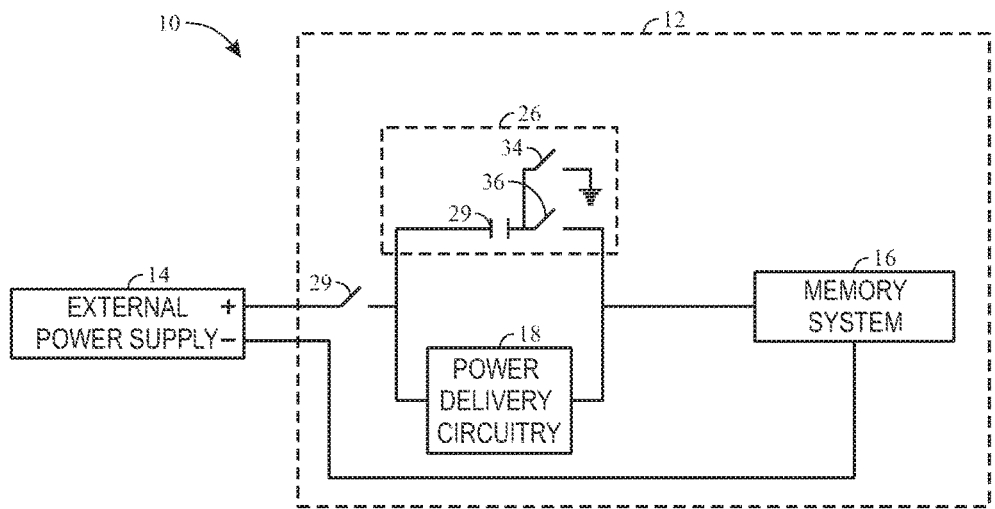
FIG. 4 is a block diagram of a system having an external power supply and memory device with power delivery circuitry, illustrating another embodiment of the power delivery circuitry.

FIGS. 2-4 are block diagrams of the system 10 having the external power supply 14 and the memory device 12, illustrating various embodiments of the power delivery circuitry 18 of the memory device 12. More specifically, the embodiments shown in FIGS. 2-4 illustrate various circuit topologies of the energy storage device 26. For example, FIG. 2 illustrates an embodiment of the energy storage device 26 including a feed-forward capacitor 28. It may be appreciated that the feed-forward capacitor 28 may be substituted with any other two-terminal energy storage device, such as a battery. Further, the feed-forward capacitor 28 may include a capacitance range between 100 µF and 2 F for a solid state drive memory device 12.

The power delivery circuitry 18 may include a step-down type voltage regulator to convert voltage from the external power supply 14 to a voltage that meets voltage requirements of the memory system 16. It may be appreciated that the step-down type voltage regulator of the power delivery circuitry 18 may include a buck mode DC-to-DC converter, a low dropout regulator (LDO), a buck-boost DC-to-DC converter operating in buck mode, or any other step-down type voltage regulator. By way of example, the external power supply 14 may provide five volts to the power delivery circuitry 18, and the power delivery circuitry 18 may step-down the five volt supply to a 3.3 volt operating level of the memory system 16. While the memory system 16 ultimately receives the stepped-down voltage from the power delivery circuitry 18, the feed-forward capacitor 28 may receive the full voltage from the external power supply 14 to charge the feed-forward capacitor 28.

During events when the external power supply 14 is removed from the power delivery circuitry 18 and the feed-forward capacitor 28, such as during a power outage, the feed-forward capacitor 28 may provide backup power to the memory system 16. By way of example, when the external power supply 14 is removed from the memory device 12, the feed-forward capacitor 28 will attempt to maintain an output of the power delivery circuitry 18 at a constant level. Further, to enable the feed-forward capacitor 28 to provide the backup power, an isolation switch 29 may be provided between the external power supply 14 and the power delivery circuitry 18 and energy storage device 26. When the external power supply 14 stops providing power to the memory device 12, the switch 29 may be opened to avoid a short circuit to ground from the output of the external power supply 14.

FIG. 3 illustrates an embodiment of the energy storage device 26 including the feed-forward capacitor 28, a current limiting resistor 30, and a discharge switch 32. The current limiting resistor 30 may limit in-rush current into the feed-forward capacitor 28 when the feed-forward capacitor 28 is charging. To transmit the current through the current limiting resistor 30, the discharge switch 32 may remain open during charging of the feed-forward capacitor 28. Additionally, to reduce any energy lost as heat to the current limiting resistor 30 while the feed-forward capacitor 28 discharges, the discharge switch 32 may close. With the discharge switch 32 closed during a discharge operation, the current provided from the feed-forward capacitor 28 to the power delivery circuitry 18 may avoid flowing through the current limiting resistor 30. It may be appreciated that the current limiting resistor 30 and the discharge switch 32 may be positioned on either side of the feed-forward capacitor 28, and the discharge switch 32 may be any type of switching device.

During events when the external power supply 14 is removed from the power delivery circuitry 18 and the energy storage device 26, such as during a power outage, the discharge switch 32 may close and the feed-forward capacitor 28 may provide backup power to the memory system 16 via the power delivery circuitry 18. Further, to enable the feed-forward capacitor 28 to provide the backup power, the isolation switch 29 may be provided between the external power supply 14 and the power delivery circuitry 18 and the energy storage device 26. When the external power supply 14 stops providing power to the memory device 12, the switch 29 may be opened to avoid a short circuit to ground from the output of the external power supply 14.

Additionally, in some control schemes, the discharge switch 32 and the current limiting resistor 30 may operate as a pre-charge circuit. In such a control scheme, the discharge switch 32 may remain open during a brief period of time after the external power supply 14 is coupled to the memory device 12. The current limiting resistor 30 may limit the in-rush current supplied to the feed-forward capacitor 28, and, once the feed-forward capacitor 28 reaches an adequate charge state, the discharge switch 32 may be closed to provide a more direct flow of current to the feed-forward capacitor 28. The discharge switch 32 may remain closed until an additional pre-charge event is desirable, at which point the discharge switch 32 may open again.

FIG. 4 illustrates an embodiment of the energy storage device 26 including the feed-forward capacitor 28, a grounding switch 34, and an output switch 36. During charging operations of the feed-forward capacitor 28, the grounding switch 34 may be closed, while the output switch 36 is open. This switching strategy couples one end of the feed-forward capacitor 28 to ground and the other end of the feed-forward capacitor 28 to the external power supply 14 during the charging operations. Alternatively, during a discharging operation, the grounding switch 34 may be opened, while the output switch 36 is closed. This switching strategy couples the end of the feed-forward capacitor 28, which was previously coupled to ground, to an output of the power delivery circuitry 18. In providing such a switching strategy during the discharging operations, an input voltage to the power delivery circuitry 18 provided by the feed-forward capacitor 28 is effectively boosted from the voltage of the external power supply 14 to the voltage of the external power supply 14 in addition to the voltage at the output of the power delivery circuitry 18. Further, to enable the feed-forward capacitor 28 to provide backup power, the isolation switch 29 may be provided between the external power supply 14 and the power delivery circuitry 18 and the energy storage device 26. When the external power supply 14 stops providing power to the memory device 12, the switch 29 may be opened to avoid a short circuit to ground from the output of the external power supply 14.

Because the energy storage device 26 of FIG. 4 provides an increased voltage level during the discharging operations of the feed-forward capacitor 28, the energy storage device 26 may provide an extended amount of time during which the feed-forward capacitor 28 is able to provide backup power for the memory device 12. This may be a result of an extended amount of time for the voltage provided by the feed-forward capacitor 28 to fall below the output voltage level of the power delivery circuitry 18. Additionally, the voltage boost provided when the grounding switch 34 is opened and the output switch 36 is closed may also provide a power boost at the input of the power delivery circuitry 18 when the external power supply 14 does not provide a sufficient power level to the memory system 16 for a brief period of time. For example, when power demands of the memory system 16 exceed the capabilities of the external power supply 14, the feed-forward capacitor 28, in conjunction with the grounding switch 34 and the output switch 36, may provide a temporary power boost to the memory system 16 to enable the memory system 16 to operate with greater efficiency. While FIGS. 2-4 are depicted as separate embodiments, it may be appreciated that combining elements of FIGS. 2-4 with each other is also conceived. For example, the current limiting resistor 30 and the discharge switch 32 of FIG. 3 may be used in combination with the grounding switch 34 and the output switch 36 of FIG. 4.

Figure 5:
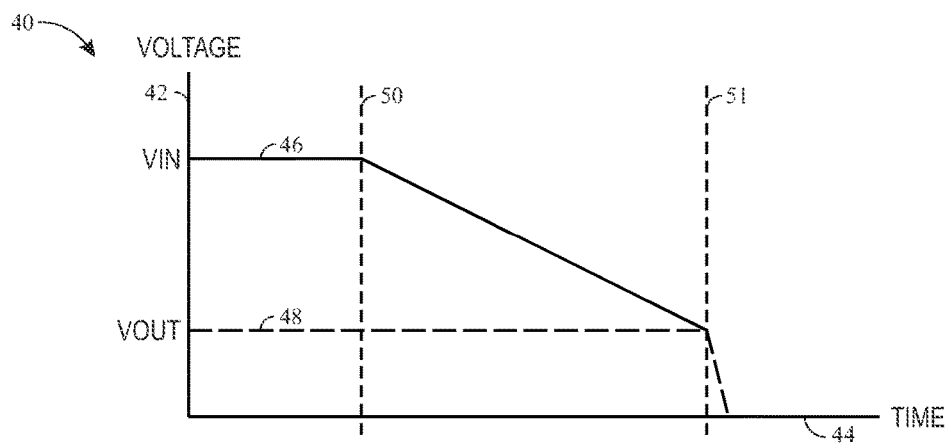
FIG. 5 is a graph illustrating voltage inputs and outputs of the system of FIGS. 2 and 3, in accordance with an embodiment.

FIG. 5 is a graph 40 illustrating voltage values 42 over time 44 for an input voltage to the power delivery circuitry 18 and an output voltage from the power delivery circuitry 18 of the memory devices 12 illustrated in FIGS. 2 and 3. In the graph 40, the input voltage is represented by line 46 and the output voltage is represented by line 48. Additionally, the line 46 represents the voltage 42 provided by the external power supply 14 or the feed-forward capacitor 28 over the time 44. Similarly, the line 48 represents the voltage 42 provided to the memory system 16 from the power delivery circuitry 18 over the time 44.

At time 50, the external power supply 14 may be removed from the memory device 12. For example, the external power supply 14 may experience a power outage at the time 50 and/or the isolation switch 29 may be opened. At this time, the feed-forward capacitor 28 may discharge to provide the voltage 42 to the power delivery circuitry 18. The voltage output of the feed-forward capacitor 28 may gradually diminish as the feed-forward capacitor 28 discharges. Discharging of the feed-forward capacitor 28 may be represented by the line 46 between the time 50 and time 51. At the time 51, the voltage provided by the feed-forward capacitor 28 may fall below the output voltage of the step-down type voltage regulator of the power delivery circuitry 18. Once the voltage 42 provided by the feed-forward capacitor 28 falls below the output voltage, the feed-forward capacitor 28 may rapidly discharge until the charge stored on the feed-forward capacitor 28 is entirely depleted.

The line 48, which represents the voltage applied to the memory system 16 after step-down via the power delivery circuitry 18, may maintain a constant voltage level during the discharging period of the feed-forward capacitor 28 between the times 50 and 51. When the time 51 is reached, and the voltage provided by the feed-forward capacitor 28 falls below the voltage level of the line 48, the line 48 may track the rapid discharge of the feed-forward capacitor 28 until the voltage level of the line 48 reaches zero potential. In this manner, the step-down type voltage regulator of the power delivery circuitry 18 may cease operating properly at the time 51, and the feed-forward capacitor 28 may cease providing sufficient voltage for the memory system 16 to operate.

Figure 6:
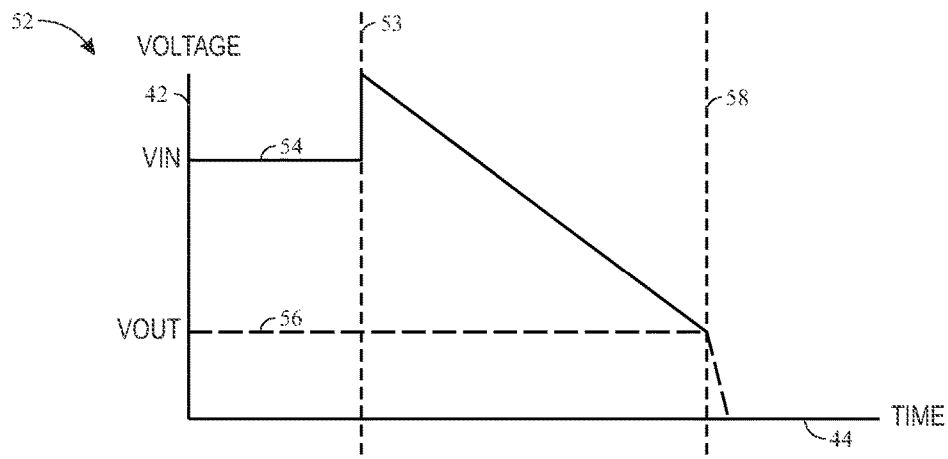
FIG. 6 is a graph illustrating voltage inputs and outputs of the system of FIG. 4, in accordance with an embodiment.

FIG. 6 is a graph 52 illustrating the voltage values 42 over the time 44 for an input voltage to the power delivery circuitry 18 and an output voltage from the power delivery circuitry 18 of the memory device 12 illustrated in FIG. 4. In the graph 52, the input voltage is represented by line 54 and the output voltage is represented by line 56. Additionally, the line 54 represents the voltage 42 provided by the external power supply 14 or the feed-forward capacitor 28 over the time 44. Similarly, the line 56 represents the voltage 42 provided to the memory system 16 from the power delivery circuitry 18 over the time 44.

At the time 53, the external power supply 14 may be removed from the memory device 12. For example, the external power supply 14 may experience a power outage at the time 53 and/or the isolation switch 29 may be opened. At this time, the grounding switch 34 may open and the output switch 36 may close, and the removal of the external power supply 14 may result in the feed-forward capacitor 28 discharging to provide the voltage 42 to the power delivery circuitry 18. Due to a leg of the feed-forward capacitor 28 switching from ground to the output of the power delivery circuitry 18, the voltage 42 of the line 54 may be increased from the voltage of the external power supply 14 to the voltage of the external power supply 14 in addition to a voltage at the output of the power delivery circuitry 18. The increase in the voltage 42 is represented by a voltage spike at the time 53 in FIG. 6.

The voltage output of the feed-forward capacitor 28 may gradually diminish as the feed-forward capacitor 28 discharges. Discharging of the feed-forward capacitor 28 may be represented by the line 54 between the time 53 and time 58. At the time 58, the voltage provided by the feed-forward capacitor 28 may fall below the output voltage of the step-down type voltage regulator of the power delivery circuitry 18. Once the voltage provided by the feed-forward capacitor 28 falls below the output voltage, the feed-forward capacitor 28 may rapidly discharge until the charge stored on the feed-forward capacitor 28 is entirely depleted. It may be appreciated that because the voltage 42 provided by the feed-forward capacitor 28 at the time 53 is greater in FIG. 6 relative to the voltage 42 provided by the feed-forward capacitor 28 at the time 50 in FIG. 5, a time period between the times 53 and 58 may be greater than a time period between the times 50 and 51. That is, the energy storage device 26 illustrated in FIG. 4 may take a greater amount of time to discharge than the energy storage devices 26 illustrated in FIGS. 2 and 3. Accordingly, the energy storage device 26 illustrated in FIG. 4 and represented by the graph 52 may provide sufficient voltage for the memory system 16 to operate for a longer period of time than the energy storage devices 26 illustrated in FIGS. 2 and 3 under similar operating conditions.

Further, the line 56, which represents the voltage applied to the memory system 16 after step-down via the power delivery circuitry 18, may maintain a constant voltage level during the discharging period of the feed-forward capacitor 28 between the times 53 and 58. When the time 58 is reached, and the voltage provided by the feed-forward capacitor 28 falls below the voltage level of the line 56, the line 56 may track the rapid discharge of the feed-forward capacitor 28 until the voltage level of the line 56 reaches zero potential. In this manner, the step-down type voltage regulator of the power delivery circuitry 18 may cease operating properly, and the feed-forward capacitor 28 may cease providing sufficient voltage for the memory system 16 to operate.

Figure 7:
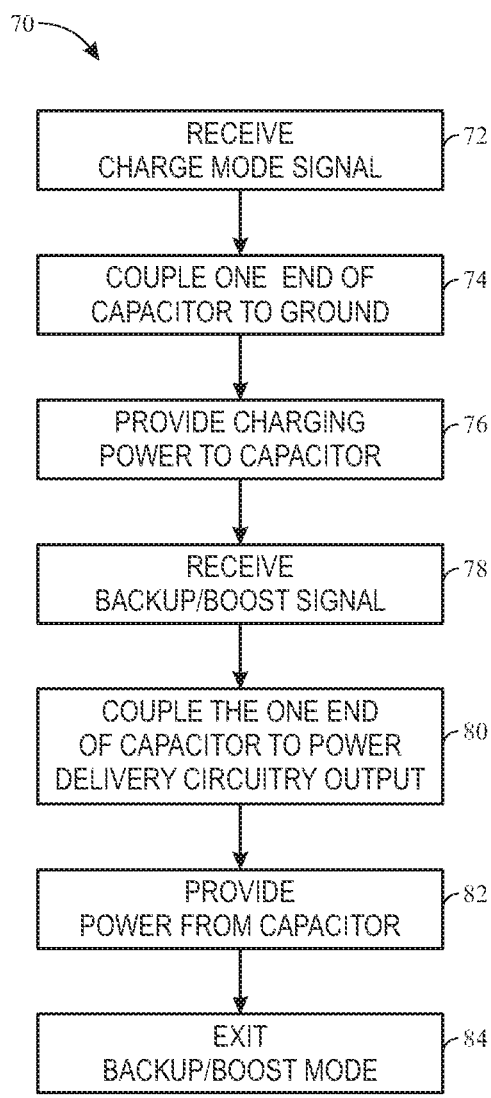
FIG. 7 is a flow diagram illustrating operation of the power delivery circuitry of the memory device of FIG. 4, in accordance with an embodiment.

FIG. 7 is a flow diagram 70 illustrating operation of the energy storage device 26 of the memory device 12 of FIG. 4. Initially, at block 72, a charge mode signal is received by the energy storage device 26. The charge mode signal may indicate to the energy storage device 26 that the external power supply 14 is operating under a condition that enables the external power supply 14 to charge the energy storage device 26. For example, the energy storage device 26 may receive the charge mode signal when the external power supply 14 resumes providing power to the memory device 12 or the memory system 16 reduces a power demand to a level that the external power supply 14 is capable of meeting.

Upon receiving the charge mode signal, at block 74, the energy storage device 26 may be instructed to couple one end of the feed-forward capacitor 28 to ground by closing the grounding switch 34, while the output switch 36 is maintained in an open position. This position may be maintained during a charging operation of the feed-forward capacitor 28, and the grounding switch 34 coupling the feed-forward capacitor 28 to ground enables the voltage stored on the feed-forward capacitor 28 to be equal to the voltage provided by the external power supply 14 rather than a difference between the voltage of the external power supply 14 and a voltage at an output of the power delivery circuitry 18. In this manner, at block 76, the external power supply 14 may provide charging power to the feed-forward capacitor 28 until a backup or boost power signal is received by the energy storage device 26.

For example, at block 78, the energy storage device 26 may receive a backup or boost power signal. The backup or boost power signal may instruct the energy storage device to transition to a discharge mode. Such a transition may be provided when the memory device 12 receives an indication that the external power supply 14 is no longer providing power to the memory device 12, or that the external power supply 14 is not providing sufficient power to meet the demands of the memory system 16 of the memory device 12.

After receiving the backup or boost power signal, the energy storage device 26, at block 80, may couple the one end of the feed-forward capacitor 28, which was previously coupled to ground, to an output of the power delivery circuitry 18 by closing the output switch 36 and opening the grounding switch 34. Additionally, the isolation switch 29 may also be opened to prevent a short circuit to ground at the output of the external power supply 14. Because the feed-forward capacitor 28 is transitioned from being coupled to ground to being coupled to the output of the power delivery circuitry 18, the voltage provided to the input of the power delivery circuitry 18 may be equal to the voltage of the external power supply 14 in addition to the voltage of the output of the power delivery circuitry 18.

The resulting voltage may be applied to the power delivery circuitry 18, at block 82, until the feed-forward capacitor 28 is completely discharged, or until the energy storage device 26 receives an exit backup or boost signal at block 84. The exit backup or boost signal may be provided be provided to the energy storage device 26 when, for example, the memory device 12 is turned off. Additionally, in some instances, immediately upon receiving an exit backup or boost mode signal, at block 84, the energy storage device 26 may receive a charge mode signal at block 72 to repeat the charging and discharging process of the flow diagram 70.

As described in detail above, embodiments of the present disclosure are directed to a system, such as the memory device 12, having power delivery circuitry 18 that in operation provides power from the external power supply 14 and/or the energy storage device 26 to the memory system 16. The energy storage device 26 of the memory device 12 includes the feed-forward capacitor 28, and the energy storage device 26 may include the current limiting resistor 30, the discharge switch 32, the grounding switch 34, and/or the output switch 36, which are components used to assist in charging and discharging operations of the energy storage device 26. The energy storage device 26 may provide backup power to the memory device 12 when the external power supply 14 is removed, and/or the energy storage device 26 may provide boosting power when an output of the external power supply 14 is not sufficient to operate the memory system 16. As a result, the energy storage device 26 may enable improved performance of the memory device 12.

While the subject matter described herein may be susceptible to various modifications and alternative forms, specific embodiments have been shown by way of example in the drawings and have been described in detail herein. However, it should be understood that the presently described subject matter is not intended to be limited to the particular forms disclosed. Rather, the described subject matter is to cover all modifications, equivalents, and alternatives falling within the spirit and scope of the invention as defined by the following appended claims.

What is claimed is:

1. A method comprising:
   charging an energy storage device via a first power from a power supply, wherein the energy storage device is coupled between an input of power delivery circuitry of a memory device and an output of the power delivery circuitry;
   receiving, in the power delivery circuitry, the first power from the power supply, a second power from the energy storage device, or both; and
   delivering a third power, via the power delivery circuitry, to a memory system of the memory device.

2. The method of claim 1, wherein the energy storage device is directly coupled to the input of the power delivery circuitry.

3. The method of claim 1, wherein charging comprises charging the energy storage device through a resistor configured to regulate the charging.

4. The method of claim 1, comprising directly coupling the energy storage device to the input of the power delivery circuitry via a switch configured to bypass a resistor.

5. The method of claim 1, wherein the third power comprises a combination of the first power and the second power.

6. The method of claim 1, wherein the memory system comprises a solid state memory system.

7. The method of claim 1, wherein the power delivery circuitry comprises a direct current (DC) to DC voltage converter.

8. The method of claim 7, wherein the DC to DC voltage converter comprises a buck mode DC to DC converter.

9. The method of claim 1, comprising supplementing the first power to the power delivery circuitry with the second power.

10. A method of manufacturing a memory device comprising:
    coupling power delivery circuitry to a memory system; and
    coupling an energy storage device between an input of the power delivery circuitry and an output of the power delivery circuitry, wherein the energy storage device is configured to supply a first power to the input energy storage device, and wherein the output of the power delivery circuitry is configured to provide a second power to the memory system.

11. The method of claim 10, wherein the energy storage device is coupled in parallel with the power delivery circuitry.

12. The method of claim 10, comprising coupling the input of the power delivery circuitry to a power supply of the memory device.

13. The method of claim 12, wherein the power delivery circuitry is configured to receive a third power from the power supply.

14. The method of claim 10, wherein coupling an energy storage device between the input of the power delivery circuitry and the output of the power delivery circuitry comprises coupling a resistor between input of the power delivery circuitry and the energy storage device.

15. The method of claim 14, comprising configuring a switch to operatively bypass the resistor.

16. The method of claim 10, wherein the energy storage device comprises a feed forward capacitor.

17. A method of manufacturing an electronic device comprising:
    coupling power delivery circuitry to one or more memory arrays, wherein the power delivery circuitry is configured to receive a first power from a power supply and supply a second power to the one or more memory arrays;
    coupling a first electrical connection of an energy storage device to an input of the power delivery circuitry, wherein the energy storage device is configured to supply a third power to the power delivery circuitry; and
    coupling a second electrical connection of the energy storage device to a ground reference via a switch, wherein the switch is configured to operatively couple the second electrical connection of the energy storage device and the ground reference during charging of the energy storage device.

18. The method of claim 17, comprising coupling the second electrical connection of the energy storage device to an output of the power delivery circuitry via a second switch, wherein the second switch is configured to operatively couple the second electrical connection of the energy storage device and the output of the power delivery circuitry during discharge of the energy storage device.

19. The method of claim 17, wherein the second power comprises only the third power.

20. The method of claim 17, wherein the power delivery circuitry comprises a step down voltage regulator.

* * * * *